United States Patent
Mosterman et al.

(10) Patent No.: US 9,245,068 B1
(45) Date of Patent: Jan. 26, 2016

(54) ALTERING AN ATTRIBUTE OF A MODEL BASED ON AN OBSERVED SPATIAL ATTRIBUTE

(71) Applicant: The MathWorks, Inc., Natick, MA (US)

(72) Inventors: Pieter J. Mosterman, Framingham, MA (US); Andrew C. Grace, Sherborn, MA (US); Ebrahim Mestchian, Newton, MA (US)

(73) Assignee: The MathWorks, Inc., Natick, MA (US)

( * ) Notice: Subject to any disclaimer, the term of this patent is extended or adjusted under 35 U.S.C. 154(b) by 473 days.

(21) Appl. No.: 13/730,159

(22) Filed: Dec. 28, 2012

Related U.S. Application Data

(63) Continuation-in-part of application No. 13/533,841, filed on Jun. 26, 2012, now Pat. No. 9,117,039.

(51) Int. Cl.
*G06G 7/48* (2006.01)
*G06F 17/50* (2006.01)

(52) U.S. Cl.
CPC .................. *G06F 17/5018* (2013.01)

(58) Field of Classification Search
None
See application file for complete search history.

(56) References Cited

U.S. PATENT DOCUMENTS

| | | | |
|---|---|---|---|
| 6,028,593 A | 2/2000 | Rosenberg et al. | |
| 8,954,195 B2 | 2/2015 | Summer et al. | |
| 2001/0037190 A1* | 11/2001 | Jung | 703/1 |
| 2002/0010655 A1 | 1/2002 | Kjallstrom | |
| 2002/0080139 A1* | 6/2002 | Koo et al. | 345/473 |
| 2005/0105793 A1 | 5/2005 | Sorek et al. | |
| 2005/0257195 A1* | 11/2005 | Morrow et al. | 717/109 |
| 2006/0008151 A1* | 1/2006 | Lin et al. | 382/190 |
| 2006/0038816 A1 | 2/2006 | Guest et al. | |
| 2006/0150149 A1* | 7/2006 | Chandhoke et al. | 717/109 |
| 2006/0199167 A1 | 9/2006 | Yang et al. | |
| 2008/0007568 A1* | 1/2008 | Chou et al. | 345/629 |
| 2008/0013793 A1* | 1/2008 | Hillis et al. | 382/114 |
| 2008/0062167 A1* | 3/2008 | Boggs et al. | 345/419 |
| 2009/0058799 A1* | 3/2009 | Huang et al. | 345/156 |
| 2009/0061404 A1 | 3/2009 | Toly | |
| 2009/0073034 A1 | 3/2009 | Lin | |
| 2009/0315841 A1 | 12/2009 | Cheng et al. | |
| 2010/0009308 A1 | 1/2010 | Wen et al. | |
| 2011/0032255 A1 | 2/2011 | Favier et al. | |
| 2011/0040392 A1* | 2/2011 | Hamann et al. | 700/30 |

(Continued)

OTHER PUBLICATIONS

Nishino et al.("A Virtual Environment for Modeling 3D Objects Through Spatial Interaction", IEEE, 1999,pp. 81-86).*

(Continued)

*Primary Examiner* — Omar Fernandez Rivas
*Assistant Examiner* — Iftekhar Khan
(74) *Attorney, Agent, or Firm* — Harrity & Harrity, LLP

(57) ABSTRACT

A computing device may create a link between a first attribute of a model and an attribute from a spatial environment. The model, when executed, may simulate the behavior of a system. The computing device may further observe a physical object in the spatial environment, and receive a value of the attribute from the spatial environment based on observing the physical object in the spatial environment. The computing device may also adjust a value of a second attribute, of the model, from a first value to a second value based on the created link and the received value of the attribute from the spatial environment. The computing device may execute the model using the second value.

22 Claims, 12 Drawing Sheets

(56) References Cited

U.S. PATENT DOCUMENTS

| | | | |
|---|---|---|---|
| 2011/0106339 | A1 | 5/2011 | Phillips et al. |
| 2011/0205341 | A1 | 8/2011 | Wilson et al. |
| 2011/0261083 | A1 | 10/2011 | Wilson |
| 2012/0254830 | A1* | 10/2012 | Conrad et al. ............... 717/106 |
| 2012/0276993 | A1 | 11/2012 | Lerner et al. |
| 2012/0317501 | A1* | 12/2012 | Milou ........................ 715/753 |
| 2012/0320080 | A1* | 12/2012 | Giese et al. .................. 345/619 |
| 2013/0332119 | A1 | 12/2013 | Santiquet et al. |
| 2014/0132594 | A1 | 5/2014 | Gharpure et al. |
| 2014/0157129 | A1 | 6/2014 | Dinshaw et al. |
| 2014/0163930 | A1 | 6/2014 | Balon et al. |
| 2014/0208272 | A1 | 7/2014 | Vats et al. |
| 2014/0247260 | A1 | 9/2014 | Ghoneima et al. |
| 2014/0327670 | A1 | 11/2014 | Chen et al. |

OTHER PUBLICATIONS

Laviola et al.("3D Spatial Interaction: Applications for Art, Design, and Science", SIGGRAPH 2011 Course, 2011,pp. 1-64).*

Wikipedia, "3D printing" http://en.wikipedia.org/wiki/3D_printing, May 25, 2012, 9 pages.

Co-pending U.S. Appl. No. 13/533,841 entitled "Generating a Three-Dimensional (3D) Report, Associated With a Model, From a Technical Computing Environment (TCE)" filed Jun. 26, 2012, by Mosterman et al., 80 pages.

Co-pending U.S. Appl. No. 13/730,092 entitled "Generic Human Machine Interface for a Graphical Model" filed Dec. 28, 2012, by Mosterman et al., 59 pages.

Co-pending U.S. Appl. No. 13/730,198 entitled "Linking of Model Elements to Spatial Elements" filed Dec. 28, 2012, by Ciolfi et al., 58 pages.

Co-pending U.S. Appl. No. 13/730,279 entitled "Interacting With a Model Via a Three-Dimensional (3D) Spatial Environment" filed Dec. 28, 2012, by Mosterman et al., 75 pages.

Izadi et al. "KinectFusion: real-time 3D reconstruction and interaction using a moving depth camera," Proceedings of the $24^{th}$ annual ACM symposium on User interface software and technology, ACM, 2011, pp. 559-568.

Piekarski et al. "Integrated head and hand tracking for indoor and outdoor augmented reality," Proceedings of IEEE Virtual Reality, 2004, 8 pages.

Tom Simonite, "Microsoft Has an Operating System for Your House", http://www.technologyreview.com/news/517221/microsoft-has-an-operating-system-for-your-house/?utm_campaign=newsletters&utm_content=20130718, Jul. 18, 2013, 8 pages.

Microsoft, "Microsoft Research: The Lab of Things", http://www.lab-of-things.com/, Jun. 16, 2013, 1 page.

Microsoft, "Faculty Summit 2013", http://research.microsoft.com/en-us-events/fs2013/, Jul. 16, 2013, 2 pages.

Microsoft, "HomeOS: Enabling smarter homes for everyone", http://research.microsoft.com/en-us/projects/homeos/, Jun. 22, 2011, 3 pages.

Wikipedia, "Plug and Play," http://en.wikipedia.org/wiki/Plug_and_play, Dec. 29, 2014, 6 pages.

* cited by examiner

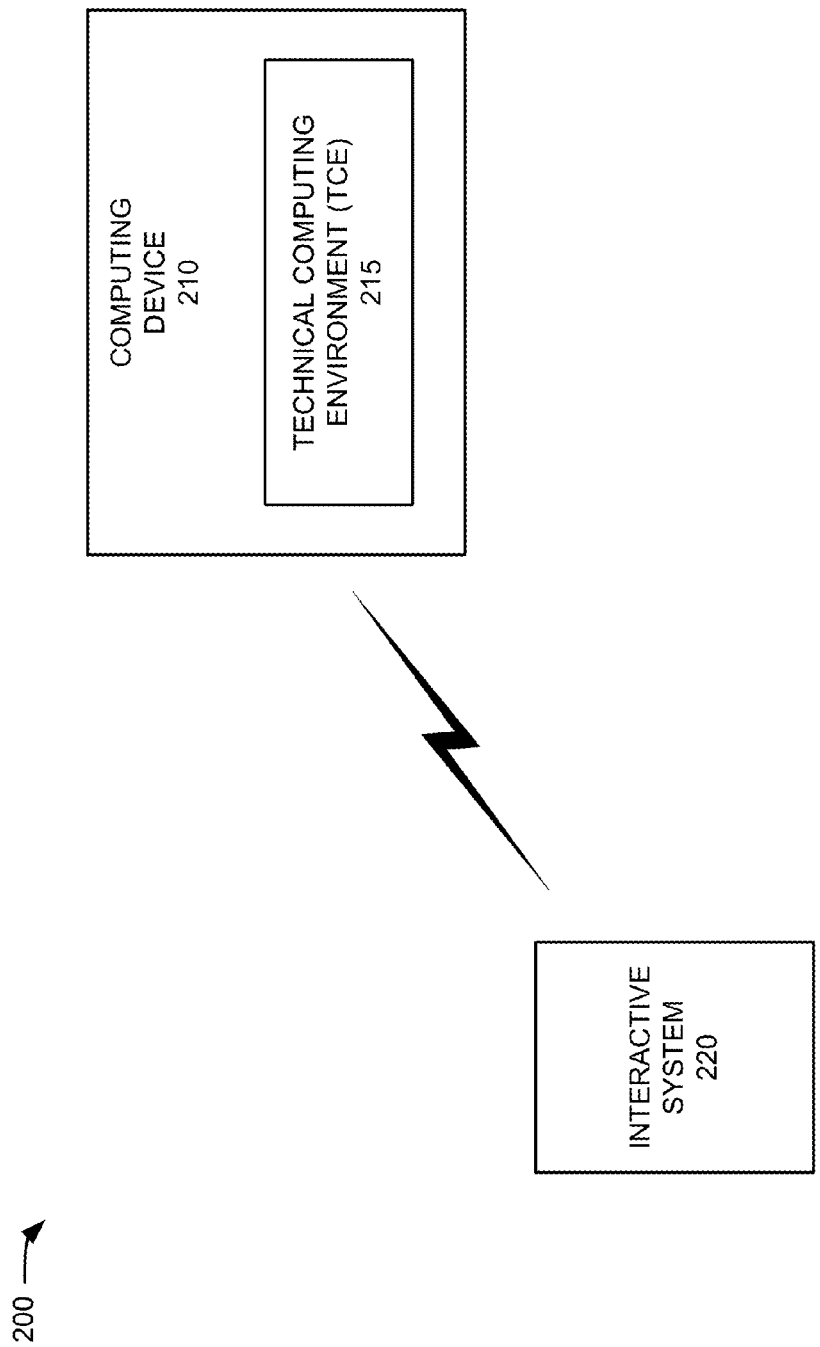

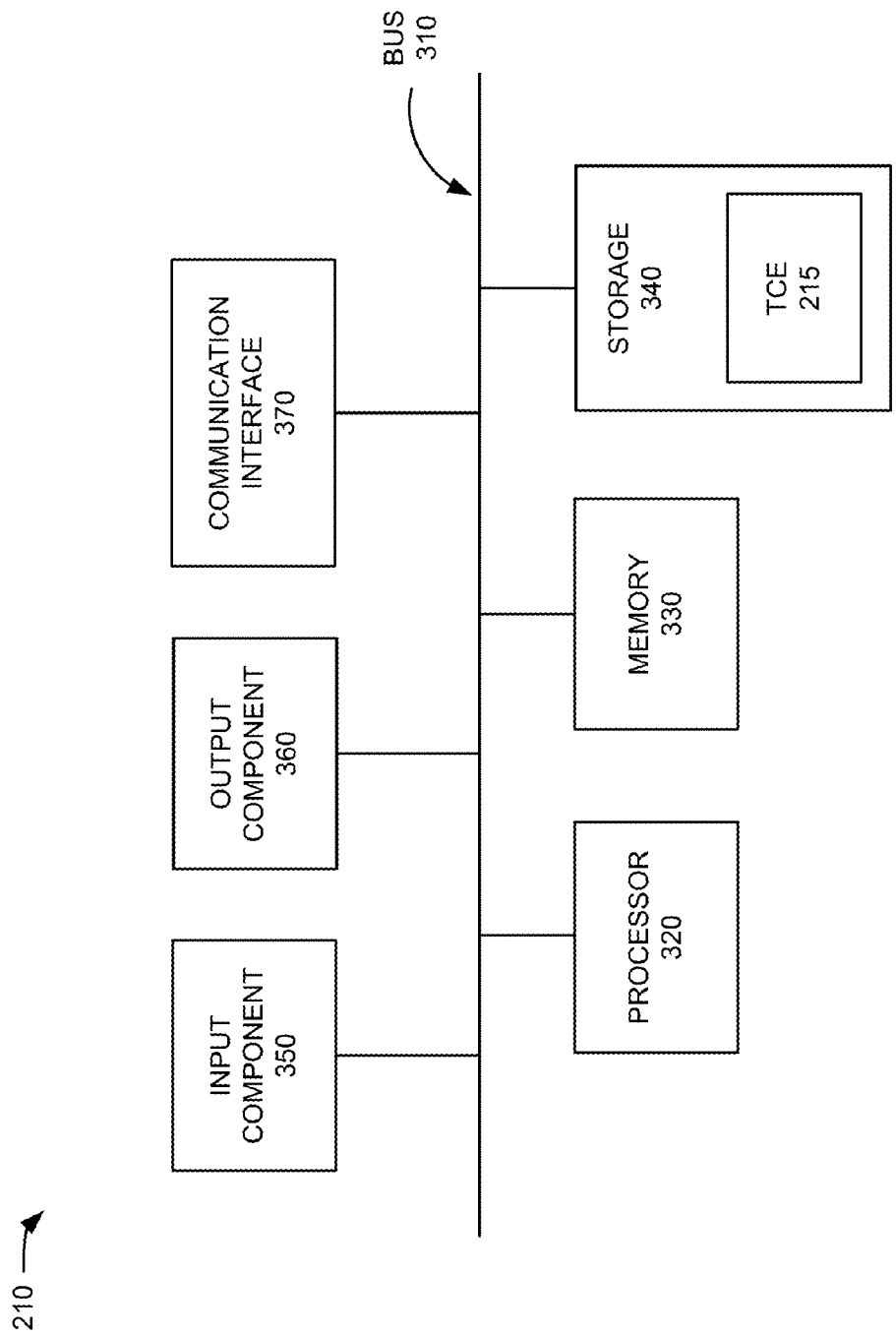

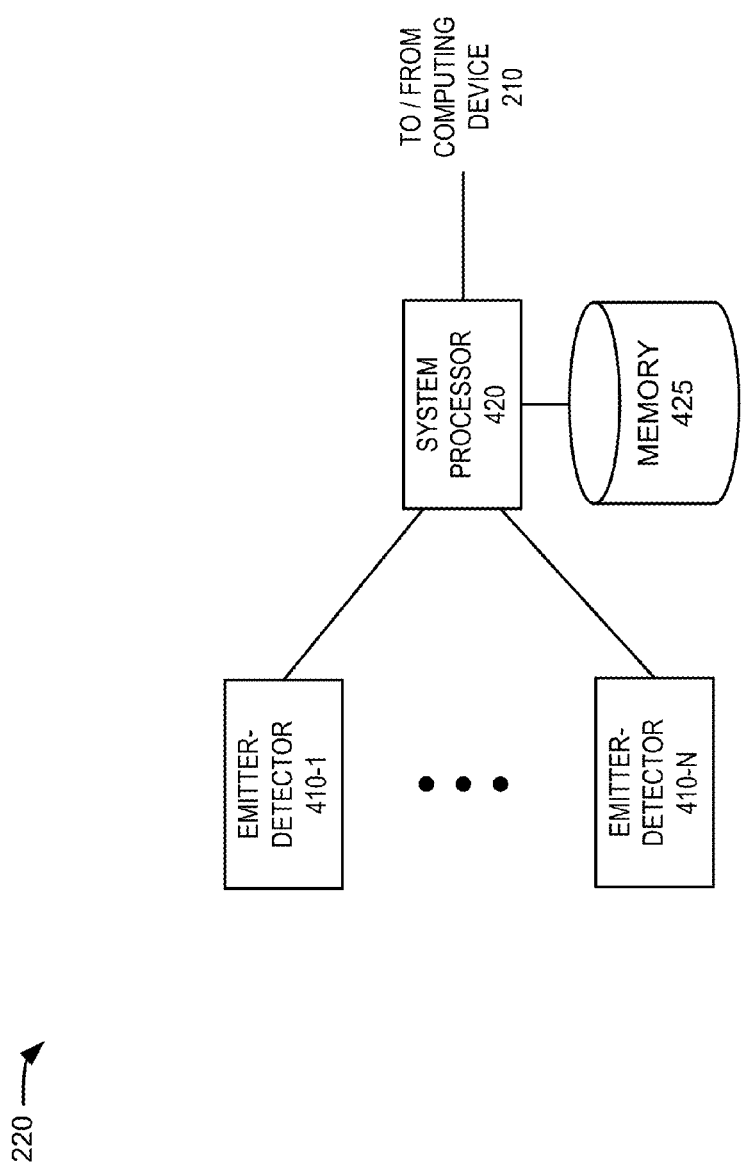

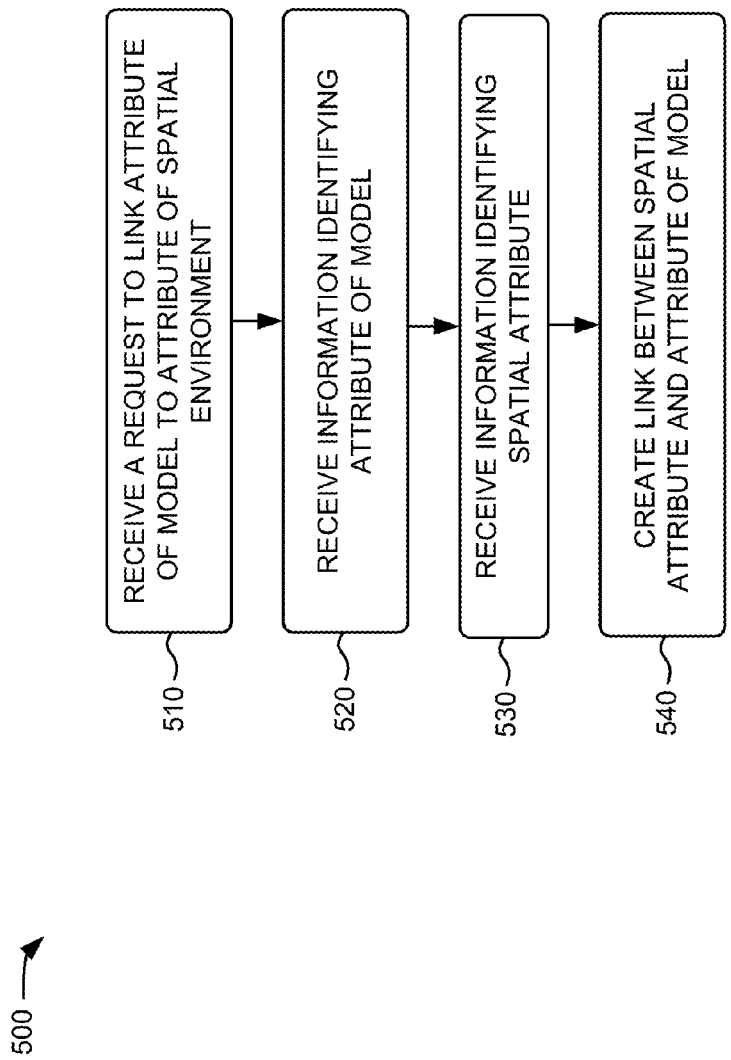

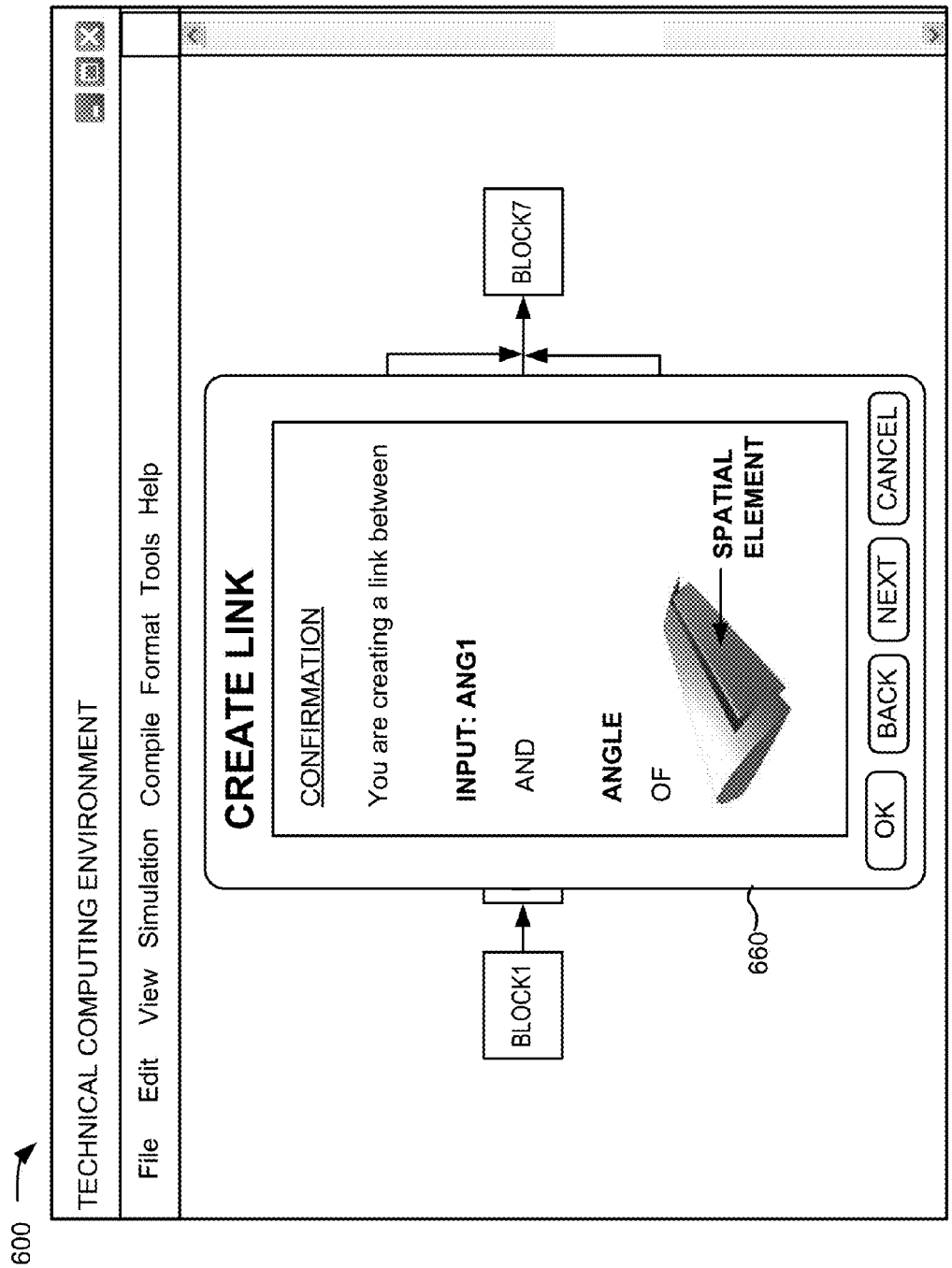

ALTERING AN ATTRIBUTE OF A MODEL BASED ON AN OBSERVED SPATIAL ATTRIBUTE

REFERENCE TO RELATED APPLICATION

This application is a Continuation-in-Part of U.S. patent application Ser. No. 13/533,841, filed Jun. 26, 2012, the entire content of which is incorporated herein by reference.

BRIEF DESCRIPTION OF THE DRAWINGS

FIG. 2 is a diagram of an example environment in which systems and/or methods, described herein, may be implemented;

FIG. 3 is a diagram of example components of the computing device of FIG. 2;

FIG. 4 is a diagram of example components of the interactive system of FIG. 2;

FIG. 5 is a flowchart of an example process for creating a link between an attribute of a model and an attribute observed in a spatial environment;

FIGS. 6A-6D are an example of the process described in connection with FIG. 5;

DETAILED DESCRIPTION

Figure 1:
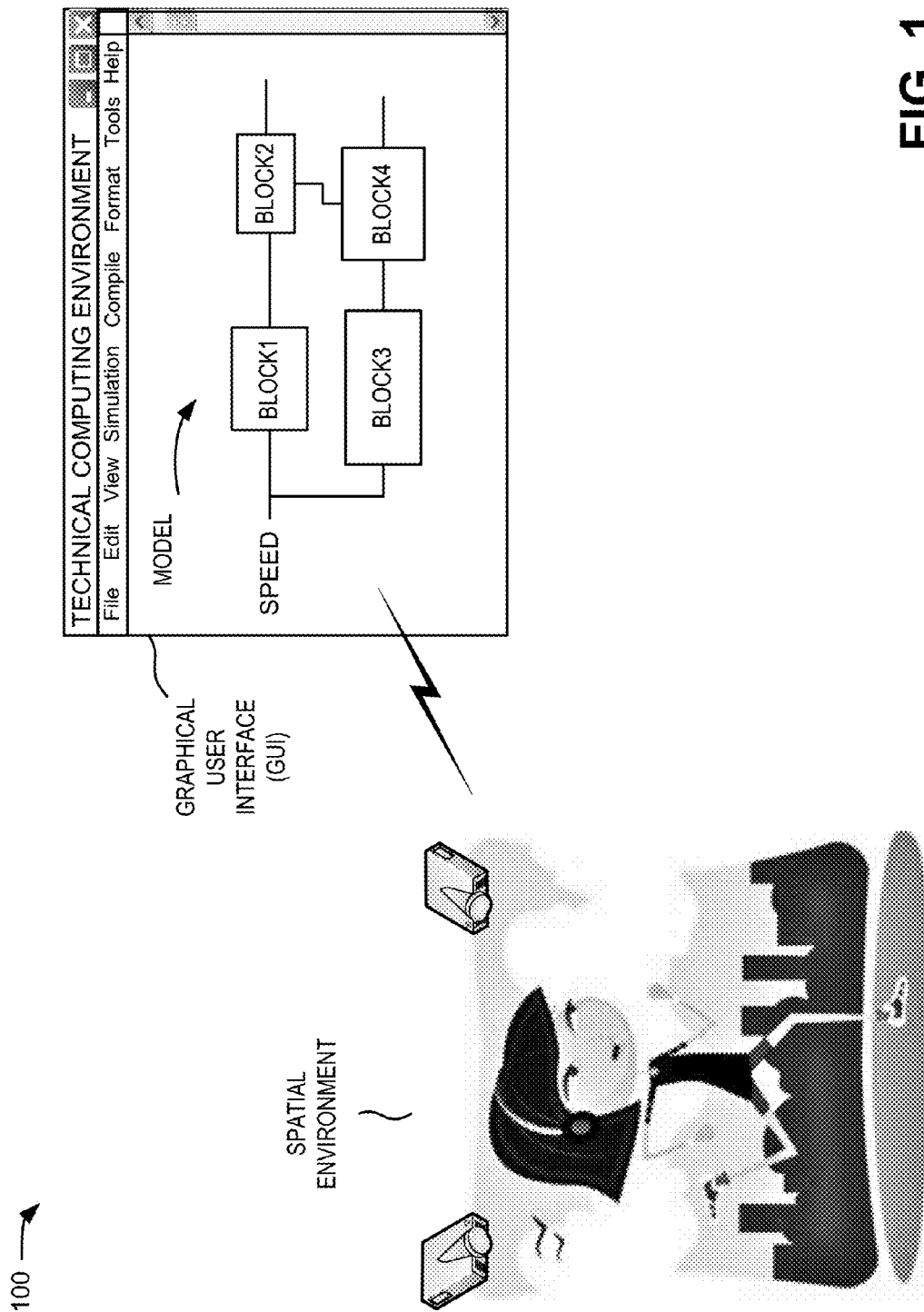
FIG. 1 is a diagram illustrating an overview of an example implementation described herein.

The following detailed description of example embodiments refers to the accompanying drawings. The same reference numbers in different drawings may identify the same or similar elements.

A model may include a set of model elements that, when executed on a computing device, simulates behavior of a system, such as a dynamic system (e.g., an airplane wing/aileron system); a natural system (e.g., human organ, a plant, etc.), a physical system (e.g., a bouncing ball, etc.), etc. The system may include a set of physical elements that correspond to portions and/or components of the system. The model elements may correspond to physical elements and may, when executed, simulate the behavior of the physical elements and/or the system. The description below is described in the context of a dynamic system for explanatory purposes only. Systems and/or methods, described herein, may also be applied to static systems.

Systems and/or methods, described herein, may enable a computing device to create a link between an attribute of a model element, in a model, and an attribute from a spatial environment. Once the link is created, the computing device may receive a value of the attribute, which has been observed in the spatial environment, and may adjust a value of the attribute of the model element based on the received value. Interacting with the model, by observing attribute values in the spatial environment, may improve a user experience when using the model to run a simulation and/or improve a manner in which the model simulates behavior of the dynamic system.

Examples of an attribute of a model element may include a constant (e.g., a model attribute that has a value that cannot be changed during execution) or a parameter (e.g., a model attribute that may change at select points in time during execution, but that are not part of the state of the dynamic system). Another example, of an attribute of a model element may include a variable (e.g., a model attribute that is the state of the dynamic system or computed from the state of the dynamic system). One type of variable that is common in models is a source value (e.g., a model attribute that is an input variable to the model).

Systems and/or methods, as described herein, may use a computing environment, such as a technical computing environment (TCE), for performing computing operations. A TCE may include any hardware-based logic or a combination of hardware and software based logic that provides a computing environment that allows tasks to be performed (e.g., by users) related to disciplines, such as, but not limited to, mathematics, science, engineering, medicine, and business. The TCE may include text-based environments (e.g., MATLAB® software), a graphically-based environment (e.g., Simulink® software, Stateflow® software, SimEvents® software, Simscape™ software, etc., by The MathWorks, Inc.; VisSim by Visual Solutions; LabView® by National Instruments; etc.), or another type of environment, such as a hybrid environment that may include, for example, one or more of the above-referenced text-based environments and one or more of the above-referenced graphically-based environments.

The TCE may be integrated with or operate in conjunction with a graphical modeling environment, which may provide graphical tools for constructing models of systems and/or processes. The TCE may include additional tools, such as tools designed to convert a model into an alternate representation, such as source computer code, compiled computer code, or a hardware description (e.g., a description of a circuit layout). This alternate representation may also include a link to a tag that is associated with the model element. The tag, thus, may enable the TCE to navigate to the model element and/or to one or more hierarchical levels of a model in which the model element exists. Additionally, or alternatively, the tag may enable the TCE to navigate to an element, in the alternative representation, that includes the link to the tag. Additionally, or alternatively, the tag may enable the TCE to navigate to one or more hierarchical levels, of the alternate representation, in which the element exists. In some implementations, the TCE may provide this ability using graphical toolboxes (e.g., toolboxes for signal processing, image processing, color manipulation, data plotting, parallel processing, etc.). In some implementations, the TCE may provide these functions as block sets. In some implementations, the TCE may provide these functions in another way.

Models generated with the TCE may be, for example, models of a physical system, a computing system, an engineered system, an embedded system, a biological system, a chemical system, etc. The models may be based on differential equations, partial differential equations, difference equations, differential and algebraic equations, discrete-event systems, state transition systems, state charts, data-flow systems, etc. In some implementations, models may be hierarchical, and include a number of hierarchical levels. A hierarchical level, of a hierarchical model, may be represented by an entity, such as a subsystem or a subchart. The subsystem or subchart may be associated with a local namespace, where data may be globally accessible within the namespace, but not outside the namespace.

A model generated with the TCE may include, for example, any equations, action language, assignments, constraints, computations, algorithms, functions, methods, and/or process flows. The model may be implemented as, for example, time-based block diagrams (e.g., via the Simulink® product, available from The MathWorks, Incorporated), discrete-event based diagrams (e.g., via the SimEvents® product, available from The MathWorks, Incorporated), dataflow diagrams, state transition diagram (e.g., via the Stateflow® product, available from The MathWorks, Incorporated), software diagrams, a textual array-based and/or dynamically typed language (e.g., via the MATLAB® product, available from The MathWorks, Incorporated), noncausal block diagrams (e.g., via the Simscape™ product, available from The MathWorks, Incorporated), and/or any other type of model.

The values of attributes of a model generated with the TCE may be set to characteristics settings, such as one or more default settings, one or more inherited settings, etc. For example, the data type of a variable that is associated with a block may be set to a default data type, such as a double. Because of the default setting, an alternate data type (e.g., a single, an integer, a fixed point, etc.) may be inferred based on attributes of elements that the model includes (e.g., the data type of a variable associated with a connected block) and/or attributes of the graphical model. As another example, the causality of an equation (i.e., which variable in the equation is computed by using that equation) associated with a block may be inferred based on attributes of elements that the model includes (e.g., the fixed causality of source elements in the model, the preferred causality of integration over time, etc.).

As yet another example, the sample time associated with a block may be set to be inherited. In case of an inherited sample time, a specific sample time may be inferred based on attributes of elements that the graphical model includes and/or attributes of the graphical model (e.g., a fundamental execution period). This inference may be performed by propagation of model element attributes. For example, after evaluating the sample time attribute of a first block, a graph search may proceed by evaluating the sample time attribute of a second block that is directly connected to the first block. The evaluating of the sample time attribute of the second block may account for the sample time attribute value of the first block (e.g., by adopting the value of the sample time attribute of the first block). Other attributes may also be inferred, such as dimension attributes and complexity attributes (e.g., whether a variable has an imaginary part).

As previously mentioned, an example embodiment of the TCE may use one or more text-based products, such as textual modeling environments. For example, a text-based modeling environment, may be implemented using products such as, but not limited to, MATLAB by The MathWorks, Incorporated; Octave, Python, Comsol Script, and MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim. In some embodiments, the text-based modeling environment may include hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc.

In some implementations, the text-based modeling environment may include a dynamically typed language that may be used to express problems and/or solutions in mathematical notations familiar to those of skill in the relevant arts. For example, the modeling environment may use an array as a basic element, where the array may not require dimensioning. These arrays may be used to support array programming in that operations can apply to an entire set of values, such as values in an array. Array programming may allow array-based operations to be treated as a high-level programming technique or model that lets a programmer think and operate on entire aggregations of data without having to resort to explicit loops of individual non-array, i.e., scalar operations.

The modeling environment may further be adapted to perform matrix and/or vector formulations that may be used for data analysis, data visualization, application development, simulation, modeling, algorithm development, etc. These matrix and/or vector formulations may be used in many areas, such as statistics, finance, image processing, signal processing, control design, computer aided design (CAD), product life cycle management (PLM), life sciences, education, discrete event analysis and/or design, state based analysis and/or design, etc.

In another example embodiment, the TCE may be implemented in a graphically-based modeling environment using products such as, but not limited to, Simulink®, Stateflow®, SimEvents®, Simscape™, etc., by The MathWorks, Incorporated; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from Telelogic; Ptolemy from the University of California at Berkeley; or aspects of a Unified Modeling Language (UML) or SysML environment.

FIG. 1 is a diagram illustrating an overview 100 of an example implementation described herein. With reference to FIG. 1, assume a user, of a computing device, has created, in a TCE and on a graphical user interface, a model that includes a number of interconnected model elements, shown as BLOCK1, BLOCK2, BLOCK3, and BLOCK4. For overview 100, assume that the model, when executed, simulates the behavior of a treadmill. Further, assume that BLOCK1 and BLOCK3 receive an input corresponding to a speed and that the user desires to link this speed attribute of the model to the speed of an individual observed in a spatial environment.

Thus, the user may use the computing device to create a link between the speed attribute of BLOCK1 and BLOCK3 and a speed that is be observed in a spatial environment. Once the link has been created, the spatial environment may observe the speed of the individual and may convey this speed to the computing device. The computing device may adjust a value of the input of BLOCK1 and BLOCK3 based on the observed speed. Thereafter, the computing device may continue to readjust the value of the input based on changes to the observed speed from the spatial environment.

FIG. 2 is a diagram of an example environment 200 in which systems and/or methods, described herein, may be implemented. As illustrated, environment 200 may include a computing device 210 and an interactive system 220.

Computing device 210 may include one or more devices capable of creating and/or executing a model. For example, computing device 210 may include a server, a workstation, a mainframe, a computer (e.g., a desktop computer, a laptop computer, a tablet computer, etc.), and/or some other type of computational device. Computing device 210 may generate, compile, and/or execute code.

Computing device 210 may host a TCE 215. TCE 215 may include hardware-based logic or a combination of hardware and software-based logic that provides a computing environment. TCE 215 may permit a user to perform tasks related to a discipline or a domain. For example, TCE 215 may pertain to mathematics, science, engineering, medicine, business, and/or another type of discipline or domain in a manner similar to that described above. In some implementations, TCE 215 may be hosted by another device, such as a server, that is located remotely from computing device 210.

Interactive system 220 may provide a spatial environment capable of communicating with computing device 210. Interactive system 220 may, for example, include one or more cameras, video cameras, infrared cameras, sonar, radar, depth sensors, microphones, multi-array microphones, lasers, photo detectors, radio frequency (RF) transmitters and/or receivers, electromagnetic field detectors, etc. Interactive system 220 may provide the spatial environment by monitoring a 3D volume of space. Interactive system 220 may, based on monitoring the 3D volume of space, obtain information (e.g., images, video, audio, RF signatures, optical signatures, electromagnetic field signatures, etc.) associated with a physical object that is detected within the spatial environment.

Although FIG. 2 shows example components of environment 200, in some implementations, environment 200 may include additional components, fewer components, different components, or differently arranged components than those depicted in FIG. 2. Additionally, or alternatively, one or more components of environment 200 may perform one or more tasks described as being performed by one or more other components of environment 200.

FIG. 3 is a diagram of example components of computing device 210. As shown in FIG. 3, computing device 210 may include a bus 310, a processor 320, a memory 330, storage 340, an input component 350, an output component 360, and/or a communication interface 370.

Bus 310 may permit communication among the other components of computing device 210. For example, bus 310 may include a system bus, an address bus, a data bus, and/or a control bus. Bus 310 may also include bus drivers, bus arbiters, bus interfaces, and/or clocks.

Processor 320 may interpret and/or execute instructions. For example, processor 320 may include a general-purpose processor, a microprocessor, a data processor, a graphics processing unit (GPU), a processing core, an application specific integrated circuit (ASIC), an application specific instruction-set processor (ASIP), a system-on-chip (SOC), a programmable logic device (PLD), a chipset, and/or a field programmable gate array (FPGA).

Memory 330 may store data and/or instructions related to the operation and use of computing device 210. For example, memory 330 may store data and/or instructions that may be configured to implement an implementation described herein. Memory 330 may include, for example, a random access memory (RAM), a dynamic random access memory (DRAM), a static random access memory (SRAM), a synchronous dynamic random access memory (SDRAM), a ferroelectric random access memory (FRAM), a read only memory (ROM), a programmable read only memory (PROM), an erasable programmable read only memory (EPROM), an electrically erasable programmable read only memory (EEPROM), and/or a flash memory.

Storage 340 may store data and/or software related to the operation and use of computing device 210. For example, storage 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. Memory 330 and/or storage 340 may also include a storage device external to and/or removable from computing device 210, such as a Universal Serial Bus (USB) memory stick, a hard disk, etc. In an implementation, as illustrated, storage 340 may store TCE 215.

Input component 350 may permit the user and/or another device to input information into computing device 210. For example, input component 350 may include a keyboard, a keypad, a mouse, a display (e.g., a touch screen), a touchpad, a button, a switch, a microphone, a camera, an accelerometer, a gyroscope, neural interface logic, voice recognition logic, an input port, and/or some other type of input component. Output component 360 may permit computing device 210 to output information to the user and/or another device. For example, output component 360 may include a display, a speaker, a light emitting diode (LED), a haptic device, a tactile device, an output port, and/or some other type of output component.

Communication interface 370 may permit computing device 210 to communicate with other devices and/or systems via one or more networks. Communication interface 370 may include a transceiver-like component. For example, communication interface 370 may include an Ethernet interface, an optical interface, a coaxial interface, a radio interface, and/or some other type of wireless and/or wired interface.

As will be described in detail below, computing device 210 may perform certain operations relating to implementations described herein. Computing device 210 may perform these operations in response to processor 320 executing software instructions (e.g., computer program(s)) contained in a computer-readable medium, such as memory 330 and/or storage 340. A computer-readable medium may be defined as a non-transitory memory device. A memory device may include space within a single physical memory device or spread across multiple physical memory devices. The software instructions may be read into memory 330 from another computer-readable medium, such as storage 340, or from another device via communication interface 370. The software instructions contained in memory 330 may cause processor 320 to perform processes described herein. Alternatively, hardwired circuitry may be used in place of or in combination with software instructions to implement processes described herein. Thus, implementations described herein are not limited to any specific combination of hardware circuitry and software.

Although FIG. 3 shows example components of computing device 210, in some implementations, computing device 210 may include additional components, fewer components, different components, or differently arranged components than those depicted in FIG. 3. Additionally, or alternatively, one or more components of computing device 210 may perform one or more tasks described as being performed by one or more other components of computing device 210.

FIG. 4 is a diagram of example components of interactive system 220. As shown, interactive system 220 may include a group of emitter-detectors 410-1, . . . , 410-N (where N≥1) (hereinafter referred to collectively as "emitter-detectors 410" and individually as "emitter-detector 410"), a system processor 420, and a memory 425.

Emitter-detector 410 may include one or more devices that obtain information associated with a physical object located within and/or interacting with a 3D volume of space that corresponds to a spatial environment. For example, emitter-detector 410 may include a camera, a RF transmitter, a RF receiver, a speaker, a microphone, a multi-array microphone, a laser, a sonar, a radar, an infrared camera, a depth sensor, a photo detector, a magnetic and/or electromagnetic component, etc. Emitter-detector 410 may, for example, include a camera to record images and/or video (e.g., based on frequencies that correspond to visible light, infrared, ultraviolet, etc.)

of a physical object (e.g., a pen, pencil, book, a user device, such as a cellular phone, all or a portion of a user (e.g., the user's hands, fingers, head, eyes, body, etc.), etc.) within the spatial environment. Emitter-detector 410 may provide the video to system processor 420 to be processed. Additionally, or alternatively, emitter-detector 410 may include a transmitter that transmits a signal (e.g., a RF transmitter to transmit a RF signal, a speaker to transmit an acoustic signal, etc.) into the spatial environment. Emitter-detector 410 may include a receiver (e.g., a RF receiver, a microphone, etc.) to receive a signal that reflects off the physical object located within the spatial environment (e.g., a RF receiver to receive a reflected RF signal, a microphone to receive a reflected acoustic signal, etc.). The received signal may identify dimensions, surface contours, location, orientation, etc. of the physical object within the spatial environment. Emitter-detector 410 may convert the received signal to an electrical signal and/or a format that can be processed by system processor 420. Emitter-detector 410 may also, or alternatively, receive a signal from a physical object, within the spatial environment, that corresponds to a user device. In this example, the received signal may identify a location and/or an orientation, associated with the user device, within the spatial environment.

Emitter-detector 410 may also, or alternatively, include a laser that transmits an optical signal that scans the spatial environment. Emitter-detector 410 may also, or alternatively, include a photodiode and/or some other component that receives a reflected optical signal from the physical object that is located within the spatial environment. The reflected signal may identify dimensions, surface contours, location, orientation, etc. associated with the physical object within the spatial environment. Emitter-detector 410 may convert the reflected optical signal to an electrical signal and/or to a format that can be received and/or processed by system processor 420.

In some implementations, emitter-detector 410 may be implemented as two or more separate devices. In one example, emitter functions (e.g., that enable information and/or signals to be transmitted to the spatial environment) may be implemented in a separate device from detector functions (e.g., that receive transmitted and/or reflected information and/or signals from the spatial environment). For example, a first emitter-detector 410, that performs emitter functions, may transmit a signal (e.g., a RF signal, an acoustic signal, an optical signal, etc.) into the spatial environment and a second emitter-detector 410, that performs detector functions, may receive the transmitted signal and/or a reflected signal that reflects off of the physical object located within the spatial environment. The first emitter-detector 410 and the second emitter-detector 410 may be mono-static with respect to the spatial environment (e.g., associated with approximately the same viewing angle with respect to the spatial environment) or may be bi-static or multi-static with respect to the spatial environment (e.g., associated with different viewing angles with respect to the spatial environment).

System processor 420 may include one or more processors that interpret and/or execute instructions. For example, system processor 420 may include a general-purpose processor, a microprocessor, a data processor, a GPU, a processing core, an ASIC, an ASIP, a SOC, a PLD, a chipset, a FPGA, and/or another type of processor. System processor 420 may receive, from emitter-detector 410, video content and/or signals that include information associated with the physical object located within the spatial environment. System processor 420 may also, or alternatively, process the received information to create spatial information associated with the physical object. In one example, system processor 420 may receive information from two or more emitter-detectors 410 that obtain information, associated with the spatial environment, from two or more viewing angles. System processor 420 may use the information, obtained from the two or more viewing angles, to perform stereoscopic and/or holographic processing on received information to generate spatial information, associated with the physical object, based on three-spatial dimensions. In one example, the spatial information may represent a signature (e.g., a visual signature, an infrared signature, a RF signature, an acoustic signature, etc.) of the physical object (e.g., in two dimensions, three-dimensions, etc.).

System processor 420 may, for example, process the received information to identify the physical object based on dimensions (e.g., length, width, height, etc.), surface contours (e.g., boundaries, edges, curvatures, etc.), color, brightness, etc. associated with the physical object. System processor 420 may also, or alternatively, process the information to identify a location and/or an orientation, associated with the physical object, based on a three-dimensional coordinate system associated with the spatial environment. The location may be based on a coordinate system, associated with the spatial environment, such as, a Cartesian coordinate system (e.g., based on orthogonal x-axis, y-axis, z-axis), a cylindrical coordinate system (e.g., based on radial distance, height distance, and angular component), a spherical coordinate system (e.g., based on radial distance, azimuth angle, and polar angle), etc. The orientation may also, or alternatively, be represented by an amount of roll, pitch, and/or yaw of the physical object within the spatial environment. System processor 420 may also use the received information to identify particular gestures (e.g., hand gestures, etc.) and/or movements by a user and/or the physical object that represent instructions (e.g., select a spatial element, select a model element, execute a model, change an orientation, change an attribute associated with a model, change a value of an attribute associated with a model, etc.) to be interpreted by computing device 210. System processor 420 may also use the received information to determine a change in location and/or orientation, of the user and/or the physical object, as a function of time. System processor 420 may provide the processed information, as spatial information, to computing device 210.

Memory 425 may include one or more memory devices that store data and/or instructions related to the operation and use of interactive system 220. For example, memory 425 include a RAM, a DRAM, a SRAM, a SDRAM, a FRAM, a ROM, a PROM, an EPROM, an electrically erasable programmable read only memory EEPROM, a flash memory, and/or another type of memory. Memory 425 may also, or alternatively, store spatial information obtained and/or generated based on monitoring the spatial environment.

Although FIG. 4 shows example components of interactive system 220, in some implementations, interactive system 220 may include additional components, fewer components, different components, or differently arranged components than those depicted in FIG. 4. For example, in some implementations, system processor 420 and/or memory 425 may be located within computing device 210. Additionally, or alternatively, one or more components of interactive system 220 may perform one or more tasks described as being performed by one or more other components of interactive system 220.

FIG. 5 is a flowchart of an example process 500 for creating a link between an attribute of a model and an attribute observed in a spatial environment. In some implementations, process 500 may be performed by computing device 210. In some implementations, one or more blocks of process 500 may be performed by one or more devices instead of, or possibly in conjunction with, computing device 210.

Process 500 may include receiving a request to link an attribute of a model to an attribute in a spatial environment (block 510). For example, computing device 210 (e.g., TCE 215) may receive a request, from a user of computing device 210, to link an attribute of a model (also referred to as a "model attribute") to an attribute in a spatial environment (also referred to as a "spatial attribute"). In some implementations, computing device 210 may receive the request based on detecting a selection of a particular menu item, entry of a particular textual or audible input from the user, and/or entry of some other predetermined input that identifies a desire to link a model attribute and a spatial attribute.

Process 500 may include receiving information identifying the model attribute (block 520). For example, computing device 210 (e.g., TCE 215) may provide a user interface, to the user, that allows the user to specify a model. In some implementations, the user interface may be provided as a separate window, such as a popup window. In some implementations, the user may provide information, to the user interface, identifying the model, such as a name of the model. In some implementations, the user may specify the model based on the user selecting the model in TCE 215 (e.g., by selecting the model in a list of available models). In these implementations, the user interface may automatically be populated with information identifying the model that was selected in TCE 215. The user may identify the model in other ways, including ways that do not include a user interface.

Computing device 210 (e.g., TCE 215) may also provide a user interface, to the user, that allows the user to specify an attribute of the model that will be linked to the spatial attribute. In some implementations, the user interface may be provided as a separate window, such as a popup window. In some implementations, the user may provide information, to the user interface, identifying the model attribute, such as a name of the model attribute. In some implementations, the user may specify the model attribute based on the user selecting the model attribute in TCE 215 (e.g., by selecting the model attribute in a list of model attributes that are associated with the model or by selecting, in TCE 215, an input to a model element to which the model attribute is associated). In these implementations, the user interface may automatically be populated with information identifying the model attribute that was selected in TCE 215. The user may identify the model attribute in other ways, including ways that do not include a user interface.

Process 500 may include receiving information identifying an attribute of the spatial environment (block 530). For example, computing device 210 (e.g., TCE 215) may provide a user interface, to the user, that allows the user to specify a spatial attribute that will be linked to the identified model attribute. In some implementations, the user interface may include a list of possible spatial attributes from which the user may select. In some implementations, the list may be populated with spatial attributes based on the attributes associated with the model. In some implementations, the user interface may identify, for the user, a spatial attribute that corresponds to the identified model attribute. In some implementations, the user interface, via which the user may identify the spatial attribute, may be provided as a separate window, such as a popup window.

In some implementations, the user interface may allow the user to specify a particular spatial element from which the spatial attribute is to be captured. For example, computing device 210 may allow the user to specify that the spatial attribute is to be captured based on observing a particular physical object or a portion of a particular physical object. In some implementations, the user may specify the particular spatial element using interactive system 220. For example, the user may provide a physical object into the spatial environment monitored by interactive system 220. In some implementations, the physical object may resemble all or a portion of the dynamic system to which the model corresponds. For example, if the model corresponds to an airplane, the physical object may be an airplane, an airplane model at scale, a portion of the airplane, a portion of an airplane model at scale, or resemblance airplane or a portion of an airplane. In some implementations, the physical object may not resemble the dynamic system or a portion of the dynamic system to which the identified model corresponds. For example, assuming again that the model corresponds to an airplane, the physical object may be a pen, a pencil, a cellular phone, a book, a part of the human body (e.g., the user's body, hand, arm, head, etc.), or another three dimensional physical object. Interactive system 220 may detect the presence of the physical object in the spatial environment and may provide information identifying the physical object to computing device 210. The information may include textual information, descriptive information, and/or visual information relating to the physical object.

In some implementations, the physical object may correspond to a portion of a physical structure located within the spatial environment. In these implementations, interactive system 220 may detect the portion of the physical object based on the user identifying the portion of the physical object within the physical structure (e.g., by pointing to the physical object). As an example, assume that the user intends to have the user's hand correspond to the model element. In this example, the user may step within the spatial environment being monitored by interactive system 220 and point to the hand that the user desires to have linked to the model element. Interactive system 220 may detect that the hand is intended to be the spatial element based on the pointing gesture. The spatial element may be identified in other ways.

Process 500 may include creating a link between the model attribute and the spatial attribute (block 540). For example, computing device 210 (e.g., TCE 215) may use the information identifying the model attribute and the information identifying the spatial attribute to create a link between the model attribute and the spatial attribute. In some implementations, computing device 210 may store information, in a data structure, identifying the link between the model attribute and the spatial attribute. In some implementations, computing device 210 may maintain the link between the model attribute and the spatial attribute in other ways.

In some implementations, computing device 210 may also store information identifying a manner in which the value of the spatial attribute is to be manipulated to obtain a value that is to be used for the model attribute. As one example, computing device 210 may store a constant that is to be combined with the value of the spatial attribute to obtain the value that is to be used for the model attribute. As another example, computing device 210 may store an equation that uses the value of the spatial attribute to obtain the value that is to be used for the model attribute. Other manners of manipulating the value of the spatial attribute to obtain the value of the model attribute may alternatively be used.

While FIG. 5 shows process 500 as including a particular quantity and arrangement of blocks, in some implementations, process 500 may include fewer blocks, additional blocks, or a different arrangement of blocks. Additionally, or alternatively, some of the blocks may be performed in parallel.

FIGS. 6A-6D are an example 600 of process 500 described above with respect to FIG. 5. As shown in relation to FIG. 6A, computing device 210 may provide a TCE that includes a model 610. As shown, model 610 may include a group of blocks, identified as BLOCK1, BLOCK2, BLOCK3, BLOCK4, BLOCK5, BLOCK6, and BLOCK7. For example 600, assume that model 610 corresponds to a portion of an airplane and that BLOCK3 corresponds to an aileron. Assume further that BLOCK3 has an input corresponding to an angle and that the user is interested in linking a spatial attribute to the angle input to BLOCK3. The user may select a menu item 620, called LINK SPATIAL ATTRIBUTE, to link the spatial attribute to the angle input.

Figure 6A:
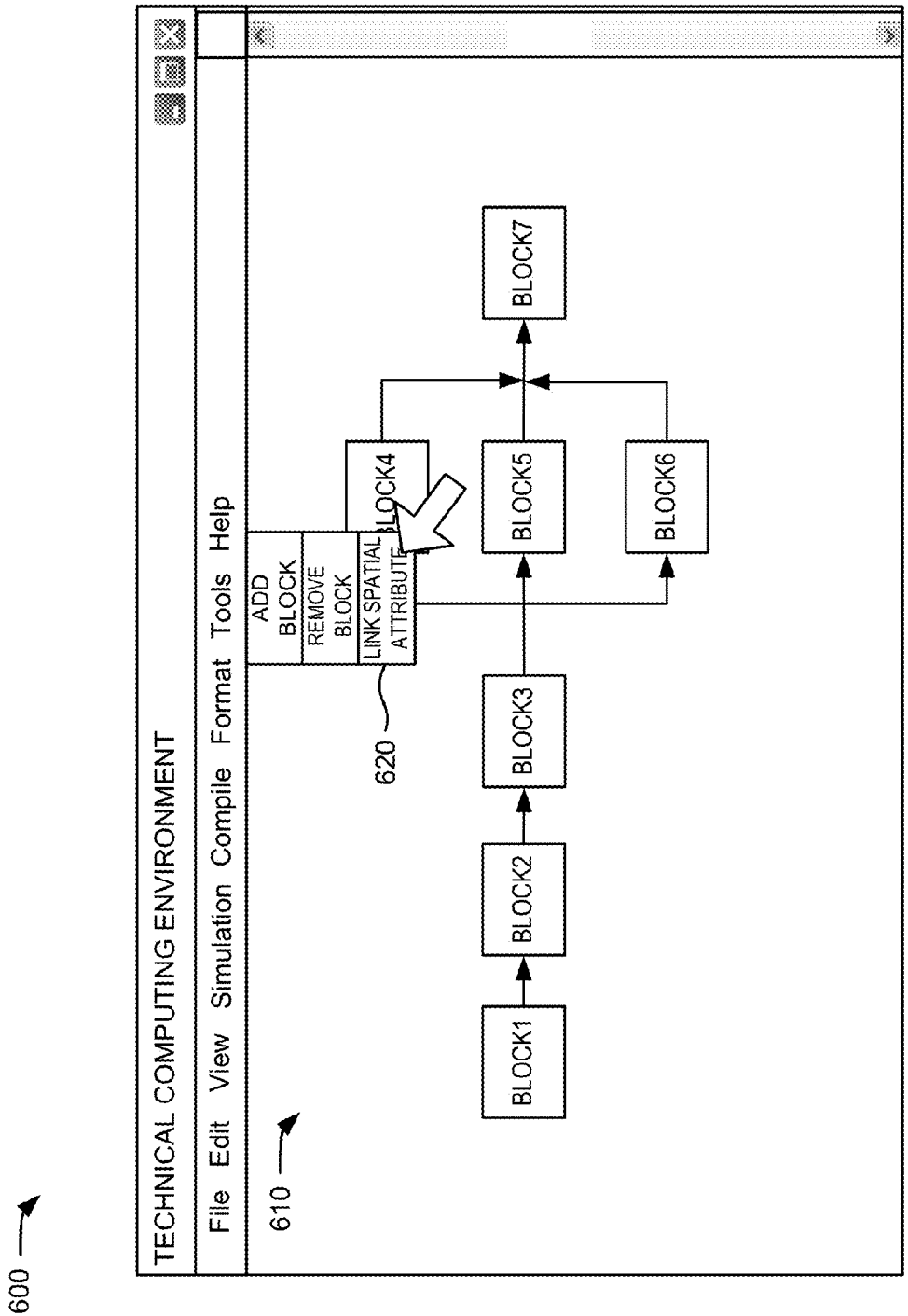
Figure 6B:
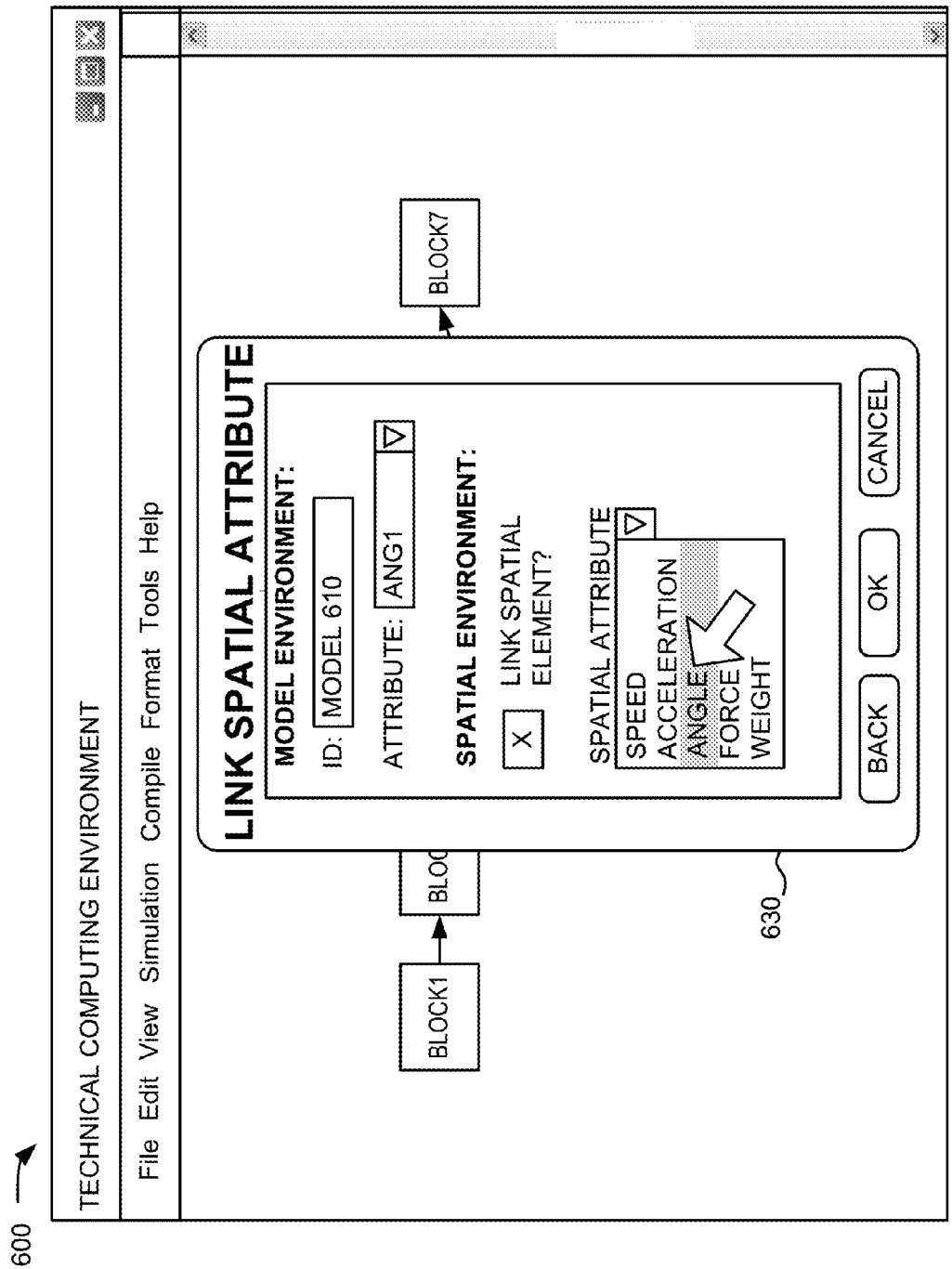

Upon detecting the selection of LINK SPATIAL ATTRIBUTE menu item 620, computing device 210 may provide a user interface 630, as shown in FIG. 6B. User interface 630 may, for example, allow the user to identify the model, the model attribute, and the spatial attribute. User interface 630 may also allow the user to specify a spatial element that is to be observed to capture the spatial attribute. With respect to the model and based on model 610 being present in the TCE when menu item 620 was selected, user interface 630 may be pre-populated with information identifying the model (i.e., MODEL 610). With respect to the model attribute, user interface 630 may provide a list of attributes associated with model 610. The user may interact with the list to identify the angle input to BLOCK3 (identified as ANG1 in FIG. 6B). With respect to the spatial attribute, user interface 630 may provide a scrollable list of attributes that may be associated with model 610. Assume that the user interacts with the list of spatial attributes in user interface 630 and selects the angle attribute.

Figure 6C:
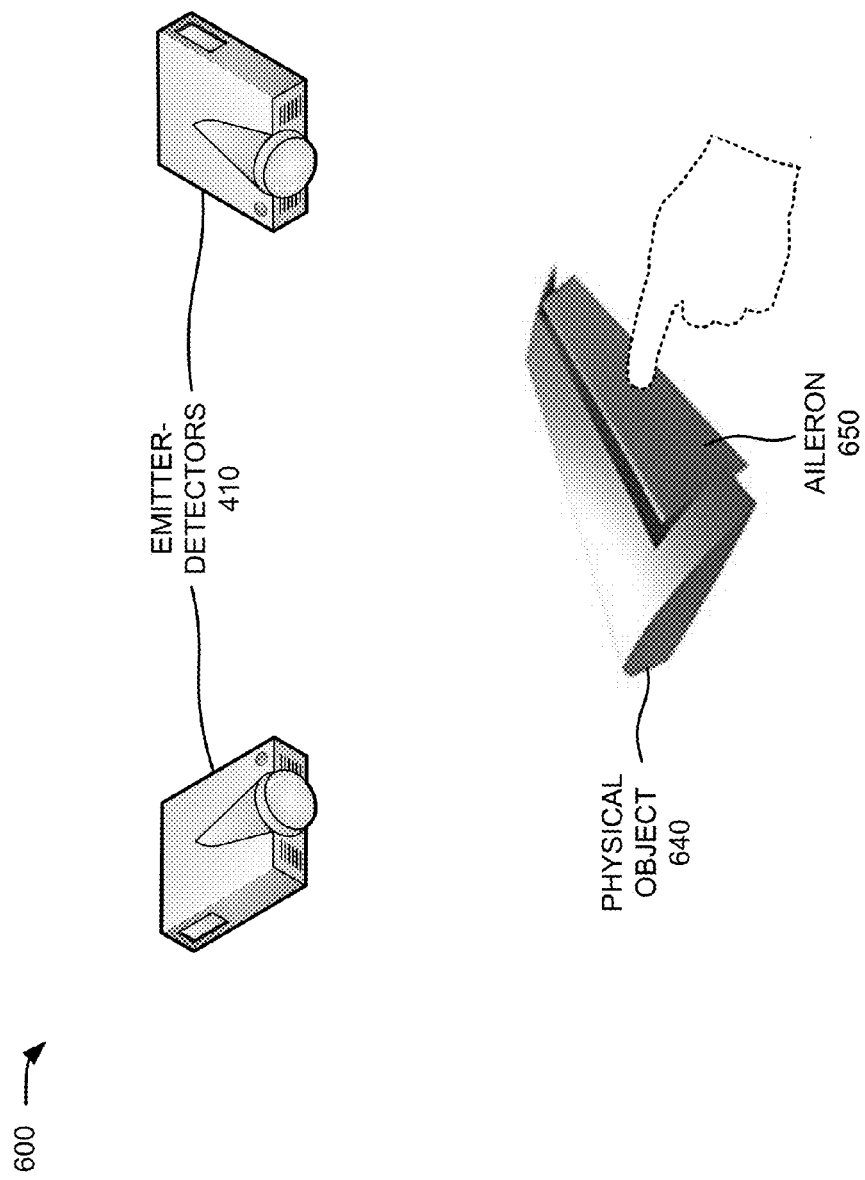

With respect to the spatial element, user interface 630 may allow the user to specify a particular spatial element that is to be observed to capture the spatial attribute. In some implementations, the user may specify the particular spatial element using interactive system 220. For example, upon selecting the LINK SPATIAL ELEMENT block and the OK button in user interface 630, computing device 210 may instruct the user to bring the spatial element into the spatial environment being monitored by interactive system 220. With reference to FIG. 6C, assume that the user brings a physical object 640 into the spatial environment. Emitter-detectors 410 may detect the presence of physical object 640 and obtain information relating to physical object 640, such as an image of physical object 640. In some implementations, interactive system 220 may identify a portion 650 of physical object 640 (e.g., as a result of the user pointing to portion 650 of physical object 640) to be used as the spatial element. Emitter-detectors 410 may obtain information relating to physical object 640 and/or portion 650 of physical object 640, as described above with respect to FIG. 4. Interactive system 220 may transmit the obtained information to computing device 210. In example 600, assume that physical object 640 resembles a wing of an airplane and that the user points to a portion 650 of the wing that is to be observed to capture the spatial attribute. Interactive system 220 may provide information relating to physical object 640 or portion 650 of physical object 640 to computing device 210.

With reference to FIG. 6D, computing device 210 may cause a user interface 660 to be provided to the user. User interface 660 may provide information confirming that the link should be created between the identified model attribute and the identified spatial attribute. In those situations where the user desires to identify a particular spatial element from which the spatial attribute is to be obtained, user interface 660 may, for example, provide an image of the spatial element.

Upon selection of the OK button, computing device 210 may create the link between the identified model attribute and the identified spatial attribute. If the user desires to link additional attributes of model 610 to spatial attributes, the user may select the NEXT button. In this situation, computing device 210 may create the link between the identified model attribute and the identified spatial attribute and provide user interface 630 so that the user may create another link.

In some implementations, user interface 660 (or another user interface) may allow the user to specify a manner in which the spatial attribute value is to be obtained. For example, assume once again that the model, when executed, simulates the behavior of a treadmill. Further, assume that the user is creating a link between a model attribute and a velocity of a person observed in a spatial environment. User interface 660 (or another user interface) may allow the user to specify the manner in which the velocity is to be captured. For example, the user may specify that one ankle of the person (in the spatial environment) is to be observed. Moreover, the user may specify that, to obtain the velocity, computing device 210 is to record displacement, of the ankle, in absolute values (i.e., back and forth distances are added) and add those absolute values together to obtain a total displacement. The user may also specify that computing device 210 is to record an amount of time for the person to cover the particular distance corresponding to the total displacement. The user may specify that computing device 210 is to divide the total displacement by the recorded time to obtain the velocity. As another example, the user may specify that, to obtain the velocity, computing device 210 is to record displacement, of both ankles, in one direction and add those recorded displacements together to obtain a total displacement. In addition, the user may specify that computing device 210 is to record an amount of time for the person to cover the particular distance corresponding to the total displacement. The user may specify that computing device 210 is to divide the total displacement by the recorded time to obtain the velocity.

In some implementations, user interface 660 (or another user interface) may allow the user to specify a manner in which the spatial attribute value is to be manipulated to obtain the model attribute value. For example, user interface 660 (or another user interface) may allow the user to specify a manner in which the spatial attribute value is to be adjusted (e.g., by addition, subtraction, multiplication, division, an equation, etc.) to obtain the model attribute value. As an example and with reference back to the previous treadmill example, the user may specify that the observed velocity of the person is to be doubled to obtain the model attribute value.

In some implementations, user interface 660 (or another user interface) may allow the user to specify a model attribute that is to be changed based on a difference in value between the value of the spatial attribute and the value of the linked model attribute. Thus, the user may specify, via user interface 660 (or another user interface), the spatial attribute, the model attribute that is to be linked to the spatial attribute, and another model attribute, the value of which is to be adjusted based on a difference in value between the value of the spatial attribute and the value of the linked model attribute.

Figure 7:
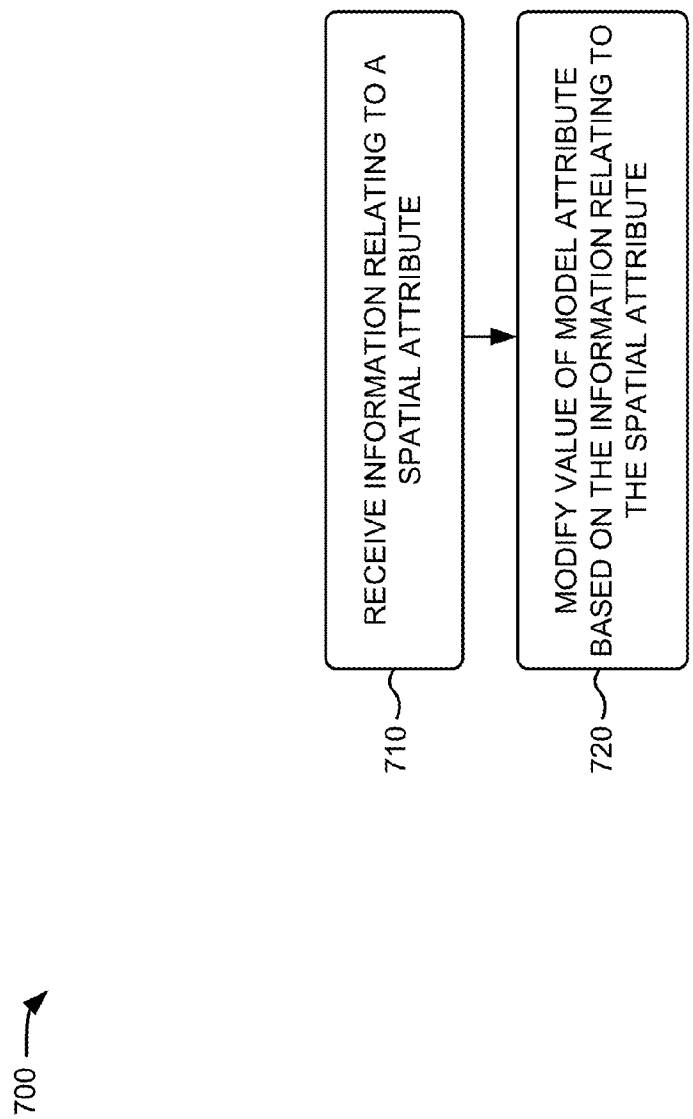
FIG. 7 is a flowchart of an example process for modifying an attribute of a model based on a spatial attribute observed in a spatial environment.

FIG. 7 is a flowchart of an example process 700 for modifying an attribute of a model based on a spatial attribute observed in a spatial environment. In some implementations, process 700 may be performed by computing device 210. In some implementations, one or more blocks of process 700 may be performed by one or more devices instead of, or possibly in conjunction with, computing device 210.

With respect to process 700, assume that a user has opened a model in a technical computing environment, such as TCE

215. For example, computing device 210 (e.g., TCE 215) may receive a request, from a user of computing device 210, to access a model. The request may include information identifying the model, such as a name of the model, and information identifying a memory location at which the model is stored. The memory location may be located within computing device 210 or external to, and possibly remote from, computing device 210. Computing device 210 may, based on receiving the request, retrieve the model from the memory location. In some implementations, computing device 210 may provide, for display, a user interface that depicts all or a portion of the model.

In addition, assume that the user has provided a spatial element, which has been linked to the model, to the spatial environment being monitored by an interactive system, such as interactive system 220. Upon providing the spatial element to the spatial environment, interactive system 220 may provide information to computing device 210 indicating that the spatial element is within the spatial environment. Computing device 210 may, in response to receiving the information indicating that the spatial element is within the spatial environment, identify a spatial attribute that is to be observed in connection with the spatial element and identify a model element that is linked to the spatial attribute.

Process 700 may include receiving information relating to the spatial attribute (block 710). For example, interactive system 220 may observe the spatial element and capture information relating to the spatial attribute. For example, in those situations where the spatial attribute is an angle, interactive system 220 may capture an angle associated with the spatial element in the spatial environment. As another example, in those situations where the spatial is a speed, interactive system 220 may capture a speed of the spatial element in the spatial environment. Thus, interactive system 220 may observe the spatial element in the spatial environment and capture a value of the appropriate spatial attribute based on observing the spatial element.

In some implementations, interactive system 220 may capture the information relating to the spatial attribute prior to the model being executed. In some implementations, interactive system 220 may capture the information relating to the spatial attribute while the model is being executed. In any event, interactive system 220 may provide information relating to the spatial attribute to computing device 210. In some implementations, the information relating to the spatial attribute may include a value of the spatial attribute. In some implementations, the information relating to the spatial attribute may include a value representative of a difference between a previous value of the spatial attribute and a current value of the spatial attribute. Computing device 210 (e.g., TCE 215) may receive the information from interactive system 220.

Process 700 may include modifying a value of a model attribute based on the information relating to the spatial attribute (block 720). For example, computing device 210 (e.g., TCE 215) may cause, in response to the received information from interactive system 220, particular actions to be performed in relation to an attribute of the model. In some implementations, the model attribute may correspond to the model attribute that is linked to the spatial attribute. In these implementations, computing device 210 may, for example, cause a value of the model attribute to match (e.g., exactly or within a tolerance) the received value of the spatial attribute. In some implementations, computing device 210 may cause the value of the model attribute to increase or decrease based on receiving the information relating to the spatial attribute. For example, in those situations where computing device 210 stores information identifying a manner in which the value of the spatial attribute is to be manipulated to obtain a value that is to be used for the model attribute, computing device 210 may manipulate the value of the spatial attribute in the identified manner to obtain the value of the model attribute. As indicated above, the value of the spatial attribute may be adjusted by addition, subtraction, multiplication, division, an equation, etc. to obtain the model attribute value.

In some implementations, the model attribute that is modified may correspond to an attribute in the model that is different than the model attribute that is linked to the spatial attribute. For example, as indicated above, the user may specify a model attribute that is to be changed based on a difference in value between the value of the spatial attribute and the value of the linked model attribute. By way of example, assume that the user specified that a velocity of an object, observed in the spatial environment (i.e., the value of the spatial attribute), is to match (e.g., exactly or within a tolerance) a corresponding velocity in the model, as obtained by executing the model (i.e., the value of the linked model attribute). In addition, assume that the user specified that another model attribute (e.g., a mass parameter, a length parameter, etc.) is to be adjusted to achieve and/or improve the match. The user may provide an initial value, a minimum value, a maximum value, a desired value, etc., for the other model attribute, which may be adjusted to achieve and/or improve the match between the value of the spatial attribute and the value of the linked model attribute.

In some implementations, computing device 210 may execute the model one or more times and computing device 210 may automatically adapt the value of the other model attribute to achieve and/or improve the match between the value of the spatial attribute and the value of the linked model attribute value (e.g., by optimization methods). In some implementations, computing device 210 may execute the model in real time and computing device 210 may make the changes to the value of the other model attribute as the model executes and the information from the interactive system 220 becomes available (e.g., in real time). In some implementations, TCE 215 may generate computer code (e.g., C, C++, hardware description language (HDL), etc.) from the model and this generated computer code may be compiled into an executable application. The executable application may then automatically adapt the value of the other model attribute to achieve and/or improve the specified match in a similar manner as computing device 210.

While FIG. 7 shows process 700 as including a particular quantity and arrangement of blocks, in some implementations, process 700 may include additional blocks or a different arrangement of blocks.

Figure 8A:
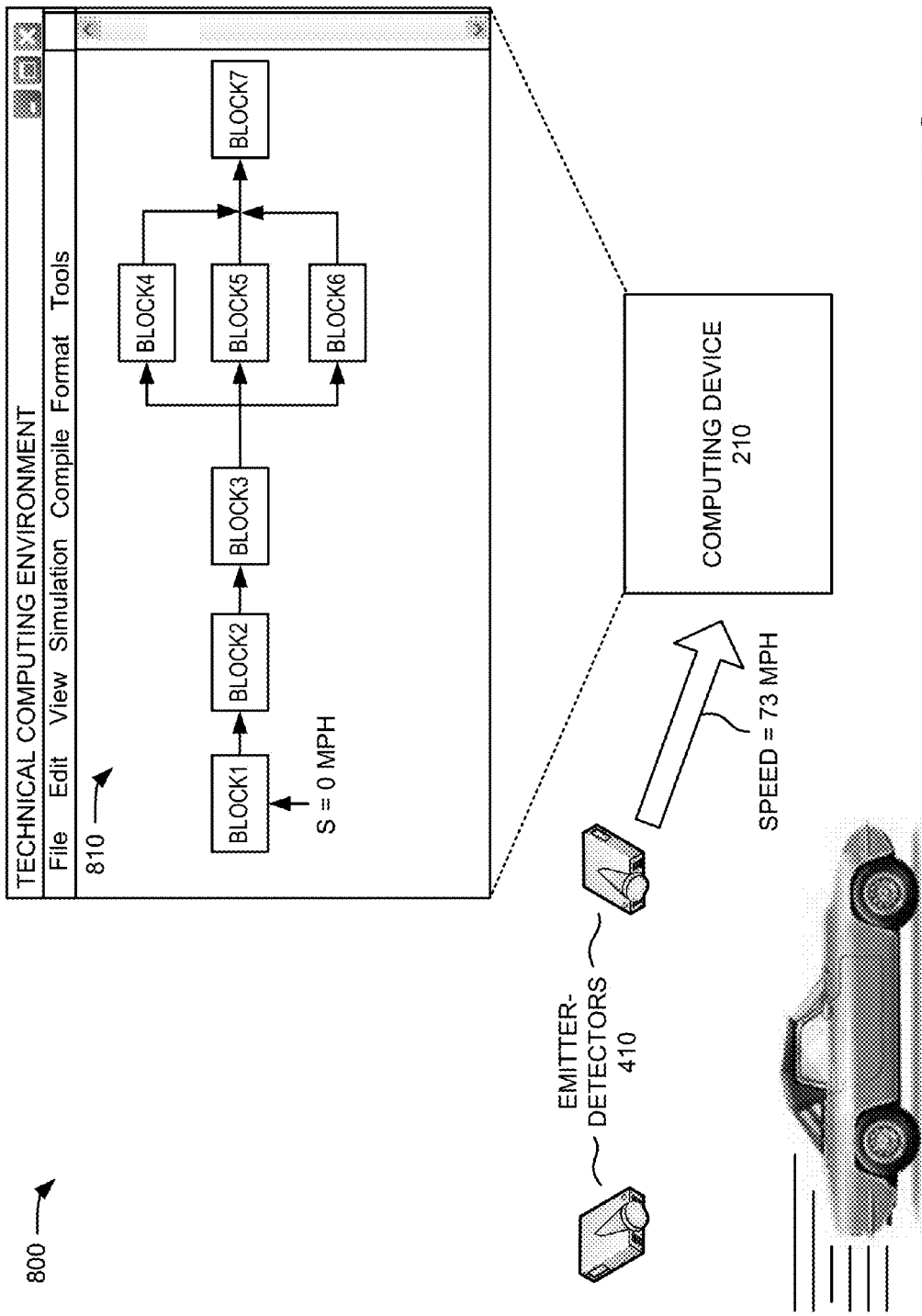
FIGS. 8A and 8B are an example of the process described in connection with FIG. 7.
Figure 8B:
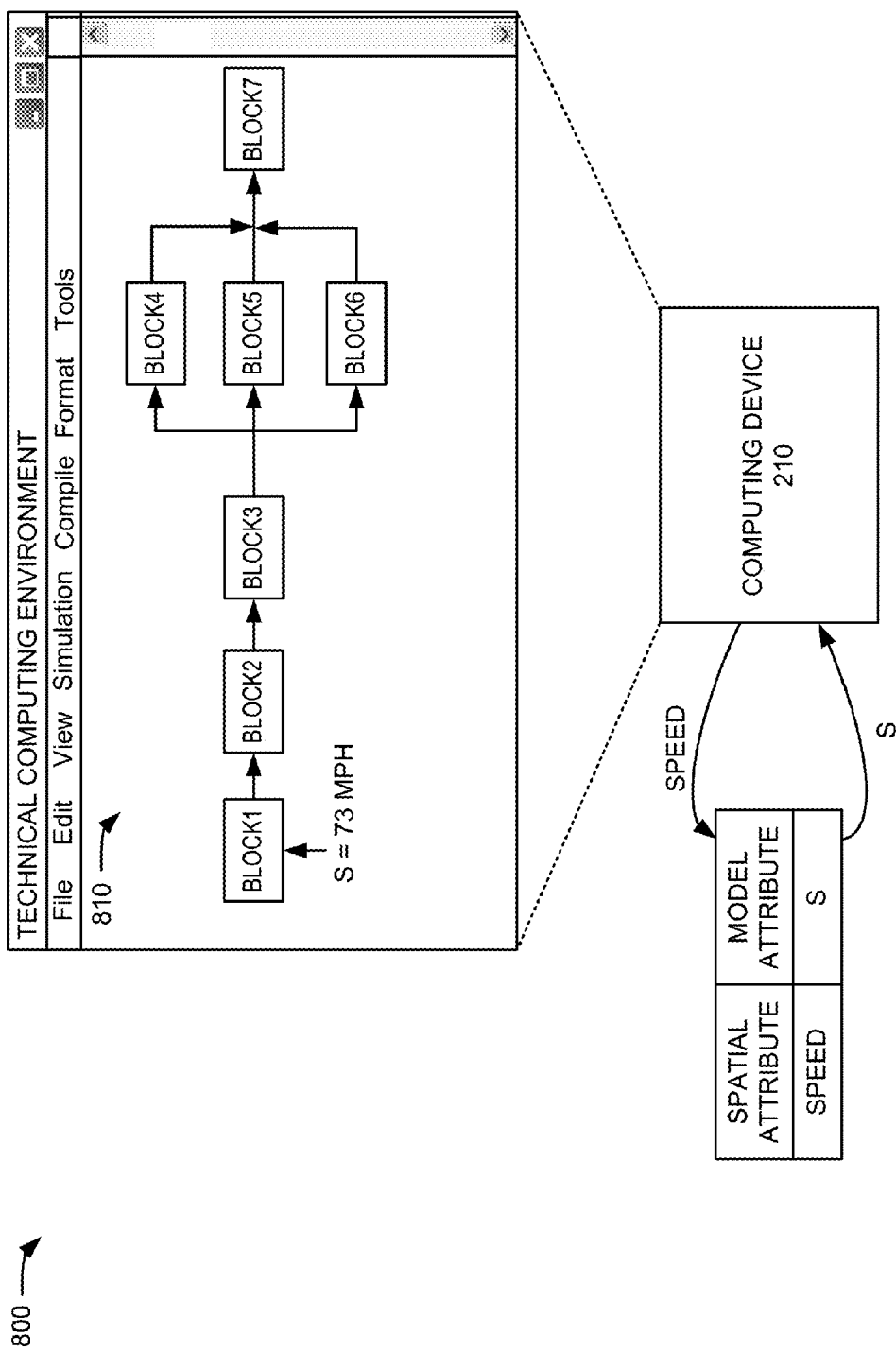

FIGS. 8A and 8B are an example 800 of process 700 described above with respect to FIG. 7. With reference to FIG. 8A, computing device 210 may provide a TCE that includes a model 810. As shown, model 810 may include a group of blocks, identified as BLOCK1, BLOCK2, BLOCK3, BLOCK4, BLOCK5, BLOCK6, and BLOCK7. For example 800, assume that BLOCK1 receives an input, S. Assume further that the input, S, corresponds to a speed. In addition, assume that the user has linked a speed of a vehicle, observed in a spatial environment, to the input, S, to BLOCK1. At an initial point in time (e.g., prior to the vehicle moving), computing device 210 may set the input, S, to a value of 0 (or some other predetermined value). Assume at some later point in time, emitters-detectors 410 observe a speed of the vehicle as 73 miles per hour (MPH). Computing device 210 may receive this observed speed of the vehicle.

With reference to FIG. 8B, computing device 210 may identify that the received speed is linked to the input, S.

Computing device 210 may then set the value of the input, S, to 73 MPH. Computing device 210 may execute model 810 using the new value of the input, S. Computing device 210 may continue to receive values for the speed of the vehicle and continue to modify the value of the input, S. In this way, values of spatial attributes observed in a spatial environment may influence the values of model attributes in a TCE.

Systems and methods, as described herein, allow a user to link an attribute, of a spatial element in a spatial environment, to an attribute of a model of a technical computing environment. Using the link, observed values of the spatial attribute, observed in the spatial environment, may affect the value of the model attribute prior to or during execution of the model.

The foregoing description provides illustration and description, but is not intended to be exhaustive or to limit the implementations to the precise form disclosed. Modifications and variations are possible in light of the above disclosure or may be acquired from practice of the implementations. For example, while the foregoing description focused on modifying a value of a model attribute based on values of a spatial attribute observed in a spatial environment, systems and methods, as described herein, are not so limited. For example, in some implementations, observations in the spatial environment may cause other types of changes to the model, such as changes to the structure of the model. As an example, assume that a person is detected, by interactive system 220, in the spatial environment. Interactive system 220 may identify a set of joints that are connected based on a skeleton of the person. With this information, computing device 210 may create (or modify) a model (e.g., of a multibody system) to reflect the detected skeleton with joints. In those situations where multiple people are detected in the spatial environment, computing device 210 may create (or modify) the model to have one multibody representation for each person. From the created (or modified) model, computing device 210 may estimate one or more attributes, such as the mass of the point masses connected through the joints. Thus, computing device 210 may create or modify a model based on observations in the spatial environment (e.g., by using system identification methods, parameter estimation methods, response optimization methods, etc.).

As used herein, the term component is intended to be broadly interpreted to refer to hardware or a combination of hardware and software, such as software executed by a processor.

It will be apparent that systems and methods, as described above, may be implemented in many different forms of software, firmware, and hardware in the implementations illustrated in the figures. The actual software code or specialized control hardware used to implement these systems and methods is not limiting of the implementations. Thus, the operation and behavior of the systems and methods were described without reference to the specific software code—it being understood that software and control hardware can be designed to implement the systems and methods based on the description herein.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

No element, act, or instruction used in the present application should be construed as critical or essential unless explicitly described as such. Also, as used herein, the article "a" is intended to include one or more items and may be used interchangeably with the phrase "one or more." Where only one item is intended, the term "one" or similar language is used. Further, the phrase "based on" is intended to mean "based, at least in part, on" unless explicitly stated otherwise.

What is claimed is:

1. A non-transitory computer-readable medium for storing instructions, the instructions comprising:
    a plurality of instructions that, when executed by a processor of a computing device, cause the processor to:
        receive a request to link a model and an attribute from a spatial environment,
            the model, when executed, simulating a behavior of a system,
        cause a user interface to be provided that allows a user to select a first attribute, from among a plurality of attributes of the model, to link to the attribute from the spatial environment,
        detect a selection of the first attribute to be linked to the attribute from the spatial environment,
        receive information identifying a selection of a physical object in the spatial environment to be monitored to obtain a value of the attribute from the spatial environment,
        create a link between the first attribute of the model and the attribute from the spatial environment based on information identifying the first attribute of the model and information identifying the attribute from the spatial environment,
        obtain the value of the attribute from the spatial environment based on monitoring the physical object in the spatial environment, and
        alter a value of a second attribute, of the model, from a first value to a second value based on the created link and the obtained value of the attribute from the spatial environment,
            the model producing a first result when the model is executed using the first value of the second attribute of the model, and
            the model producing a second, different result when the model is executed using the second value of the second attribute of the model.

2. The non-transitory computer-readable medium of claim 1, where the second attribute of the model is different than the first attribute of the model, and
    where the plurality of instructions that cause the processor to alter the value of the second attribute of the model include:
        one or more instructions to alter the value of the second attribute to increase a degree of match between the value of the attribute from the spatial environment and a value of the first attribute of the model.

3. The non-transitory computer-readable medium of claim 1, where the second attribute of the model is a same attribute as the first attribute of the model.

4. The non-transitory computer-readable medium of claim 1, where the model includes a plurality of model elements, and
    where the first attribute, of the model, corresponds to an input to a model element, of the plurality of model elements.

5. The non-transitory computer-readable medium of claim 1, where the instructions further comprise:

one or more instructions to obtain, after altering the value of the second attribute of the model, another value of the attribute from the spatial environment based on additional monitoring of the physical object in the spatial environment, and one or more instructions to alter the value of the second attribute, of the model, from the second value to a third value based on the created link and the obtained other value of the attribute from the spatial environment, the model producing a third, different result when the model is executed using the third value of the second attribute of the model.

6. The non-transitory computer-readable medium of claim 1, where the second value of the second attribute more closely matches the value of the attribute from the spatial environment than the first value of the second attribute.

7. The non-transitory computer-readable medium of claim 1, where the plurality of instructions to cause the processor to alter the value of the second attribute, of the model, from the first value to the second value include:

one or more instructions to modify the obtained value of the attribute from the spatial environment, and one or more instructions to determine the second value of the second attribute of the model based on the modified value of the attribute from the spatial environment.

8. The non-transitory computer-readable medium of claim 7, where the one or more instructions to modify the obtained value of the attribute from the spatial environment include:

one or more instructions to alter the obtained value of the attribute from the spatial environment using a constant.

9. The non-transitory computer-readable medium of claim 7, where the one or more instructions to modify the obtained value of the attribute from the spatial environment include:

one or more instructions to alter the obtained value of the attribute from the spatial environment using an equation.

10. A device comprising:

a processor to:

cause a user interface to be provided that allows a user to select a first attribute of a model, from among a plurality of attributes of the model, to link to an attribute from a spatial environment, the model, when executed, simulating behavior of a system, detect a selection of the first attribute to be linked to the attribute from the spatial environment, receive information identifying a selection of a physical object in the spatial environment to be monitored to obtain a value of the attribute from the spatial environment, create a link between the first attribute of the model and the attribute from the spatial environment, receive the value of the attribute from the spatial environment based on observing the physical object in the spatial environment, and alter a value of a second attribute of the model, from among the plurality of attributes of the model, from a first value to a second value based on the created link and the received value of the attribute from the spatial environment, the model producing a first result when the model is executed using the first value of the second attribute of the model, and the model producing a second, different result when the model is executed using the second value of the second attribute of the model.

11. The device of claim 10, where the second attribute of the model is different than the first attribute of the model.

12. The device of claim 10, where the second value of the second attribute more closely matches the value of the attribute from the spatial environment than the first value of the second attribute.

13. The device of claim 10, where, when altering the value of the second attribute, of the model, from the first value to the second value, the processor is to:

cause the second value of the second attribute, of the model, to match the received value of the attribute from the spatial environment within a tolerance amount.

14. The device of claim 10, where, when altering the value of the second attribute, of the model, from the first value to the second value, the processor is to:

modify the received value of the attribute from the spatial environment, and determine the second value of the second attribute, of the model, based on the modified value of the attribute from the spatial environment.

15. The device of claim 14, where, when modifying the received value of the attribute from the spatial environment, the processor is to:

alter the received value of the attribute from the spatial environment using a constant.

16. The device of claim 14, where, when modifying the received value of the attribute from the spatial environment, the processor is to:

alter the received value of the attribute from the spatial environment using an equation.

17. A method comprising:

causing a user interface to be provided that allows a user to select an attribute of a model, from among a plurality of attributes of the model, to link to an attribute from a spatial environment, the model, when executed, simulating behavior of a system, the causing being performed by a computing device;

detecting a selection of the attribute of the model to be linked to the attribute from the spatial environment, the detecting the selection of the attribute of the model being performed by the computing device;

receiving information identifying a selection of a physical object in the spatial environment to be monitored to obtain a value of the attribute from the spatial environment, the receiving the information identifying the selection of the physical object being performed by the computing device;

creating a link between the attribute of the model and the attribute from the spatial environment, the creating being performed by a computing device;

observing the physical object in the spatial environment, the observing being performed by the computing device;

receiving a value of the attribute from the spatial environment based on observing the physical object in the spatial environment, the receiving being performed by the computing device;

adjusting a value of the attribute, of the model, from a first value to a second value based on the created link and the received value of the attribute from the spatial environment, the adjusting being performed by the computing device; and executing the model using the second value, the executing being performed by the computing device.

18. The method of claim 17, where the model includes a plurality of model elements, and where the attribute, of the model, corresponds to an input to a model element, of the plurality of model elements.

19. The method of claim 17, further comprising:

receiving, after adjusting the value of the attribute of the model, another value of the attribute from the spatial environment based on additional observation of the physical object in the spatial environment;

adjusting the value of the attribute, of the model, from the second value to a third value based on the created link and the received other value of the attribute from the spatial environment; and executing the model using the third value.

20. The method of claim 17, where adjusting the value of the attribute, of the model, from the first value to the second value includes:

setting the second value of the attribute, of the model, equal to the received value of the attribute from the spatial environment.

21. The method of claim 17, where adjusting the value of the attribute, of the model, from the first value to the second value includes:

modifying the received value of the attribute from the spatial environment, and setting the value of the attribute, of the model, to the second value based on the modified value of the attribute from the spatial environment.

22. The method of claim 21, where modifying the received value of the attribute from the spatial environment includes:

altering the received value of the attribute from the spatial environment using at least one of a constant or an equation.

* * * * *